(12) United States Patent
Lin et al.

(10) Patent No.: US 9,577,093 B2
(45) Date of Patent: Feb. 21, 2017

(54) VERTICAL STRUCTURE AND METHOD OF FORMING SEMICONDUCTOR DEVICE

(71) Applicant: Taiwan Semiconductor Manufacturing Company Limited, Hsinchu (TW)

(72) Inventors: Cheng-Tung Lin, Hsinchu County (TW); Teng-Chun Tsai, Hsinchu (TW); Li-Ting Wang, Hsinchu (TW); De-Fang Chen, Hsinchu (TW); Bing-Hung Chen, New Taipei (TW); Huang-Yi Huang, Hsin-chu (TW); Hui-Cheng Chang, Tainan (TW); Huan-Just Lin, Hsinchu (TW); Ming-Hsing Tsai, HsinChu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/876,855

(22) Filed: Oct. 7, 2015

(65) Prior Publication Data

US 2016/0027917 A1 Jan. 28, 2016

Related U.S. Application Data

(62) Division of application No. 14/177,653, filed on Feb. 11, 2014, now Pat. No. 9,166,001.

(51) Int. Cl.
| | |
|---|---|
| *H01L 21/00* | (2006.01) |
| *H01L 21/84* | (2006.01) |
| *H01L 29/78* | (2006.01) |
| *H01L 29/06* | (2006.01) |
| *H01L 21/762* | (2006.01) |
| *H01L 21/3105* | (2006.01) |
| *H01L 21/3115* | (2006.01) |

(Continued)

(52) U.S. Cl.
CPC ....... *H01L 29/7827* (2013.01); *H01L 21/0234* (2013.01); *H01L 21/02271* (2013.01); *H01L 21/02274* (2013.01); *H01L 21/31053* (2013.01); *H01L 21/31055* (2013.01); *H01L 21/31111* (2013.01); *H01L 21/31155* (2013.01); *H01L 21/762* (2013.01); *H01L 29/0653* (2013.01); *H01L 29/0676* (2013.01); *H01L 29/66666* (2013.01)

(58) Field of Classification Search
CPC .................... H01L 21/82285; H01L 21/82341; H01L 21/823487; H01L 21/823821; H01L 21/823885
See application file for complete search history.

(56) References Cited

U.S. PATENT DOCUMENTS

| | | |
|---|---|---|
| 2012/0007258 A1 | 1/2012 | Oh et al. |
| 2015/0091057 A1* | 4/2015 | Xie ..................... H01L 27/0924 257/190 |

* cited by examiner

*Primary Examiner* — Hoai V Pham
(74) *Attorney, Agent, or Firm* — Jones Day

(57) ABSTRACT

According to an exemplary embodiment, a method of forming a semiconductor device is provided. The method includes: providing a vertical structure over a substrate; forming an etch stop layer over the vertical structure; forming an oxide layer over the etch stop layer; performing chemical mechanical polishing on the oxide layer and stopping on the etch stop layer; etching back the oxide layer and the etch stop layer to expose a sidewall of the vertical structure and to form an isolation layer; oxidizing the sidewall of the vertical structure and doping oxygen into the isolation layer by using a cluster oxygen doping treatment.

20 Claims, 16 Drawing Sheets

(51) Int. Cl.
*H01L 21/02* (2006.01)
*H01L 21/311* (2006.01)
*H01L 29/66* (2006.01)

100

1000

VERTICAL STRUCTURE AND METHOD OF FORMING SEMICONDUCTOR DEVICE

CROSS-REFERENCE TO RELATED APPLICATIONS

This application is a divisional application of U.S. patent application Ser. No. 14/177,653, entitled "VERTICAL STRUCTURE AND METHOD OF FORMING SEMICONDUCTOR DEVICE," filed Feb. 11, 2014, which is incorporated herein by reference in its entirety.

BACKGROUND

This disclosure relates generally to semiconductors, and, more particularly, to a vertical device and a method of forming a semiconductor device.

Vertical semiconductor devices, such as vertical gate-all-around transistors and FinFETs, are very popular but have complex and expensive processes. Therefore, there is a need to facilitate the manufacture thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
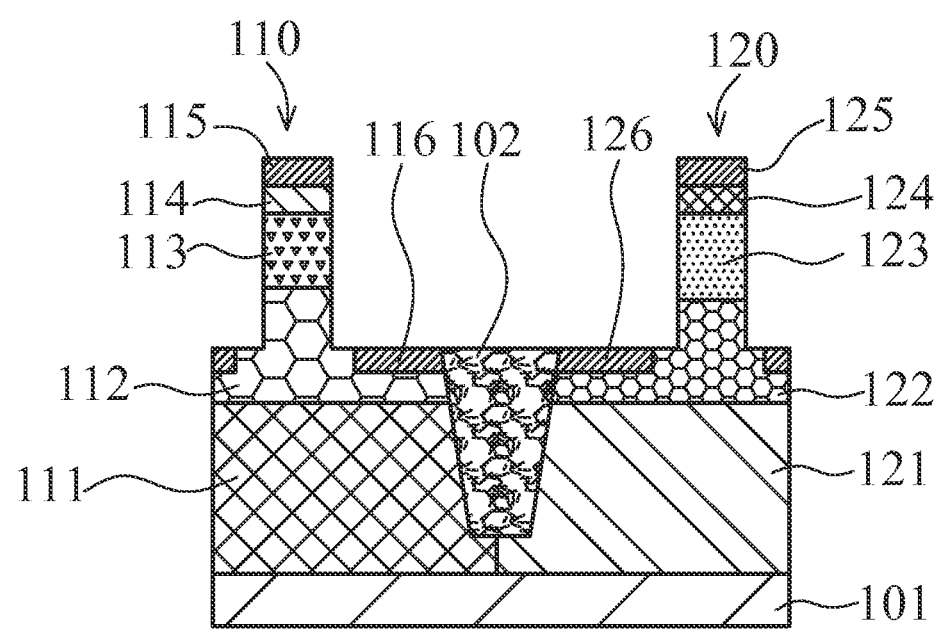
FIG. 1 is a sectional view illustrating an exemplary semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method for forming a nanowire. The method may utilize a cluster oxygen doping treatment to trim the critical dimension. The method may also utilize an oxygen plasma doping treatment alone or in combination with a cluster oxygen doping treatment to reduce a thermal annealing temperature of a chemical vapor deposition process (including a flowable CVD process) or improve the properties (such as a lower leakage current and a higher breakdown voltage) of an isolation layer. Additionally, when using the disclosed method furnace annealing, which may damage SiGe/Ge/III-V semiconductor devices, may not be necessary, so that dopant deactivation caused by thermal annealing may also decrease.

FIG. 1 is a sectional view illustrating an exemplary semiconductor device in accordance with some embodiments. As shown in FIG. 1, a semiconductor device 100 is provided. In the semiconductor device 100, a first vertical structure 110 and a second vertical structure 120 are provided over a substrate 101. The first vertical structure 110 and the second vertical structure 120 may be vertical-gate-all-around devices electrically isolated by shallow trench isolation 102. The first vertical structure 110 may be a PMOS, and may include an n-well 111, a first source 112, a first channel 113, and a first drain 114. The second vertical structure 120 may be an NMOS, and may include a p-well 121, a second source 122, a second channel 123, and a second drain 124. Salicides 115, 116, 125, 126 are used to reduce contact resistance.

The first source 112 is disposed over the n-well 111. The first channel 113 is disposed over the first source 112. The first drain 114 is disposed over the first channel 113. The second source 122 is disposed over the p-well 121. The second channel 123 is disposed over the second source 122. The second drain 124 is disposed over the second channel 123. The following procedures may be performed on the first vertical structure 110 and the second vertical structure 120, so will only be discussed below with respect to the first vertical structure 110.

Figure 2:
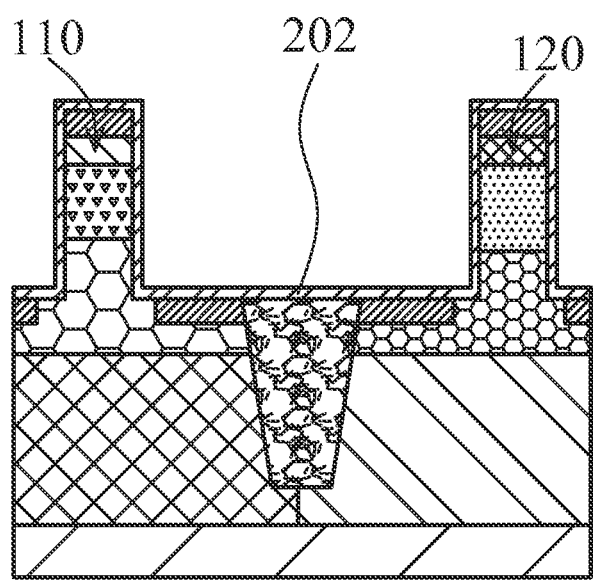
FIG. 2 is a sectional view illustrating the exemplary semiconductor device in accordance with some embodiments

FIG. 2 is a sectional view illustrating the exemplary semiconductor device 100 in accordance with some embodiments. As shown in FIG. 2, an etch stop layer 202 is formed over the first vertical structure 110 and the second vertical structure 120. The etch stop layer 202 may be formed of SiN. The etch stop layer 202 may have a thickness of, for example, about 10 nanometers.

Figure 3:
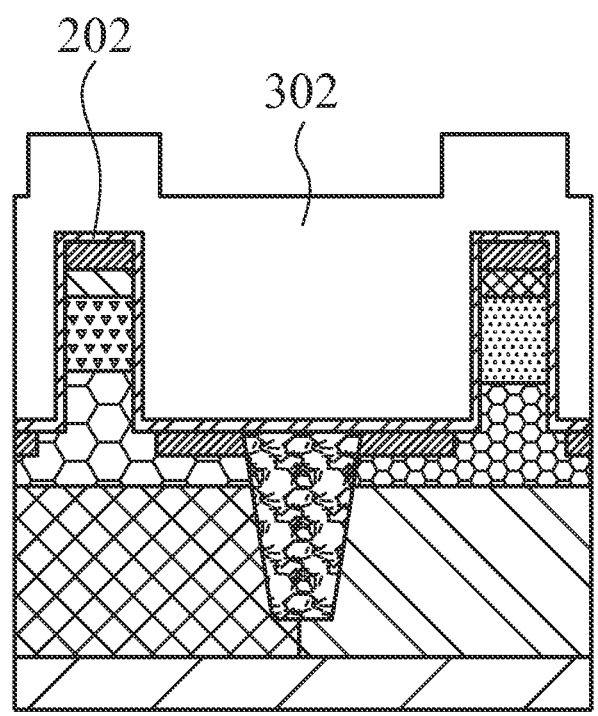
FIG. 3 is a sectional view illustrating the exemplary semiconductor device in accordance with some embodiments.

FIG. 3 is a sectional view illustrating the exemplary semiconductor device 100 in accordance with some embodiments. As shown in FIG. 3, a first oxide layer 302 is formed over the etch stop layer 1202 by using a flowable chemical vapor deposition (F-CVD) or a high-density plasma chemical vapor deposition (HDP-CVD).

Figure 4:
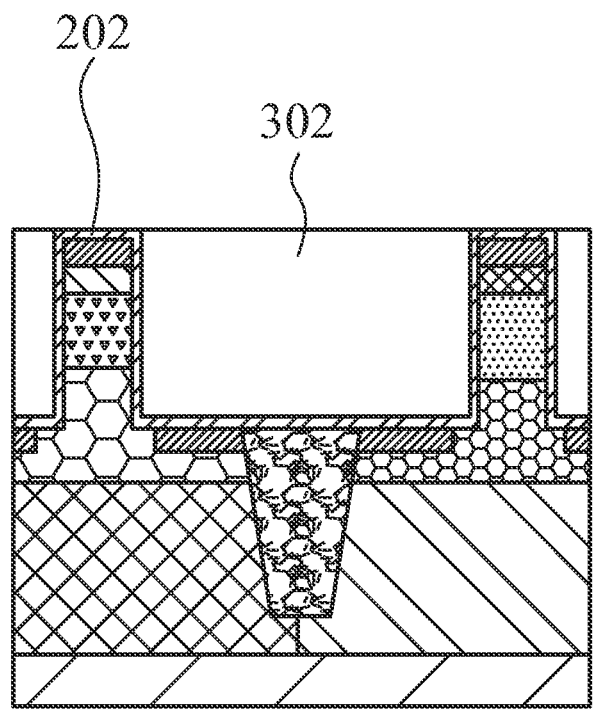
FIG. 4 is a sectional view illustrating the exemplary semiconductor device in accordance with some embodiments.

FIG. 4 is a sectional view illustrating the exemplary semiconductor device 100 in accordance with some embodiments. As shown in FIG. 4, a chemical mechanical polishing process is performed on the first oxide layer 302, stopping at the etch stop layer 202.

Figure 5:
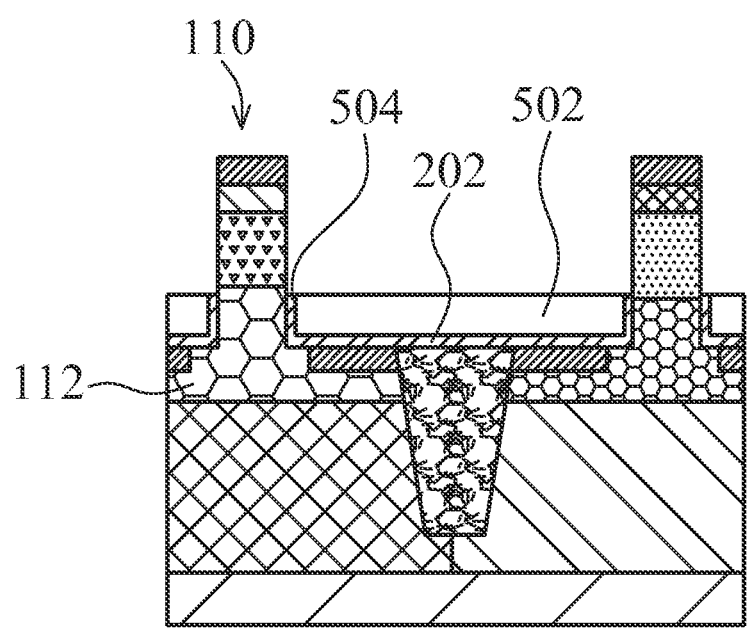
FIG. 5 is a sectional view illustrating the exemplary semiconductor device in accordance with some embodiments.

FIG. 5 is a sectional view illustrating the exemplary semiconductor device 100 in accordance with some embodiments. As shown in FIG. 5, a dry etching back process is performed on the first oxide layer 302 and the etch stop layer 202. The remaining portion of the first oxide layer 302 forms a bottom isolation layer 502. In the embodiment, a portion 504 of the etch stop layer 202 adjacent to the sidewall of the first source 112 of the first vertical structure 110 is exposed.

Figure 6:
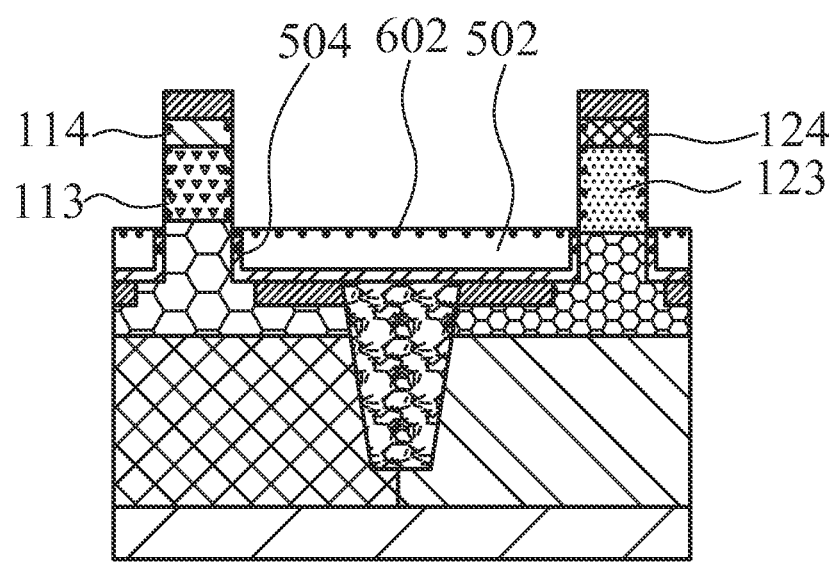
FIG. 6 is a sectional view illustrating the exemplary semiconductor device in accordance with some embodiments.

FIG. 6 is a sectional view illustrating the exemplary semiconductor device 100 in accordance with some embodiments. As shown in FIG. 6, by using a cluster oxygen doping treatment to dope oxygen 602, the exposed sidewall of the first channel 113; the first drain 114 of the first vertical structure 110; the exposed sidewall of the second channel 123; and the second drain 124 of the second vertical structure 120 are oxidized.

The bottom isolation layer 502 is oxidized by using the cluster oxygen doping treatment, so as to reduce a thermal annealing temperature of a CVD process (including a flowable CVD process) and to improve the properties (such as a lower leakage current and a higher breakdown voltage) of the bottom isolation layer 502. Additionally, in the embodiment, a furnace annealing process, which may damage SiGe/Ge/III-V semiconductor devices, may not be necessary, so that dopant deactivation due to the furnace annealing process decreases as well.

Moreover, compared to vertical structures having a small critical dimension which may be damaged easily by other processes (such as an STI gap filling process or a chemical mechanism polishing process), certain embodiments have relatively thicker critical dimensions in the vertical structures 110, 120 formed and are more robust in the face of damaging processes. The critical dimensions in the vertical structures 110, 120 may be trimmed to a target value before forming a high-K layer.

In the embodiment, the cluster oxygen doping treatment parameters are set as follows: a cluster number of about 10 to about 10000, a cluster size of about 1 nm to about 1000 nm, a cluster oxygen energy of about 3 KV to about 100 KV and a cluster oxygen dose of about $10^{11}/cm^3$ to about $10^{16}/cm^3$.

Figure 7:
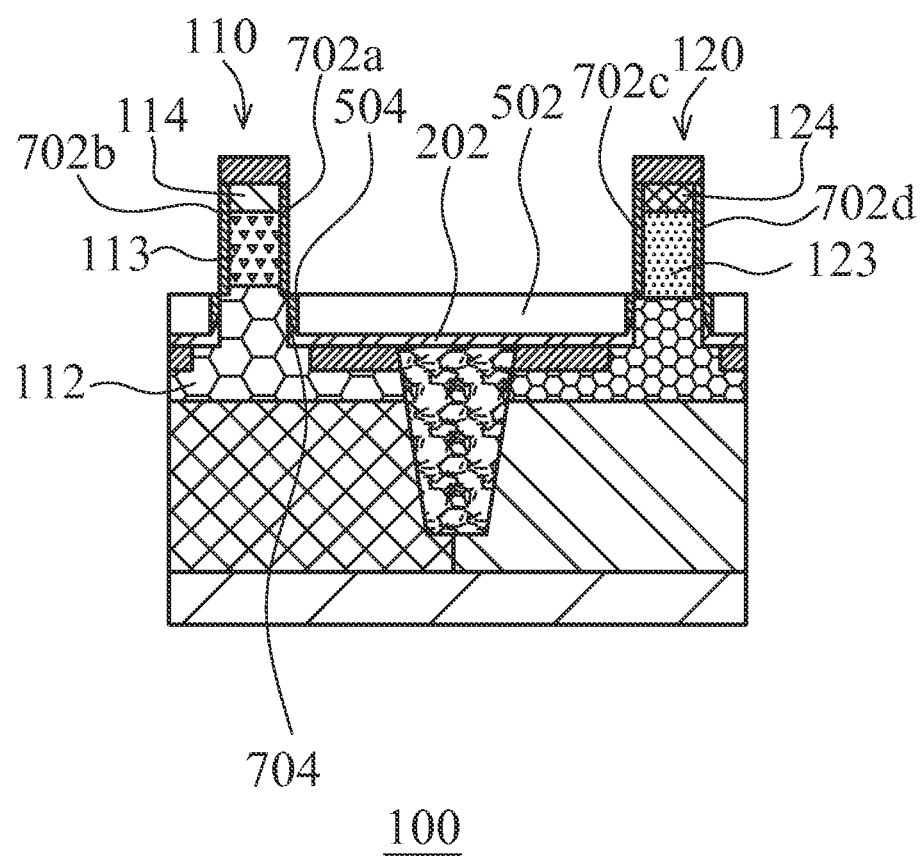
FIG. 7 is a sectional view illustrating the exemplary semiconductor device in accordance with some embodiments.

FIG. 7 is a sectional view illustrating the exemplary semiconductor device 100 in accordance with some embodiments. As shown in FIG. 7, after using a cluster oxygen doping treatment, oxides 702a, 702b, 702c, 702d are formed on the surfaces of the first channel 113, the first drain 114, the second channel 123 and the second drain 124. Additionally, the portion 504 of the etch stop layer 202 adjacent to the sidewall of first source 112 of the vertical structure 110 is oxidized to make a thickness gradient of oxidation from top to bottom. The portion of the etch stop layer 202 below the bottom isolation layer 502 remains substantially without oxidation.

In the embodiment, an additional wet or dry cleaning process may be performed to remove the oxides 702a, 702b, 702c, 702d adjacent to the sidewall of the first vertical structure 110 and the second vertical structure 120 so that the critical dimensions of the first vertical structure 110 and the second vertical structure 120 are trimmed. Furthermore, after removing the oxides 702a, 702b, 702c, 702d, an interfacial layer (IL) or high-K (HK) dielectric and a work function metal (WFM) layer may be further deposited over the first vertical structure 110, the second vertical structure 120, and the bottom isolation layer 502.

In the embodiment, the first vertical structure 110 includes the source 112, the channel 113, the drain 114, and the oxide including the bottom isolation layer 502 and the oxidized portion 504. The source 112 contacts the oxidized portion 504. The first vertical structure 110 may further include an unoxidized portion 704 of the etch stop layer 202 adjacent to the sidewall of the first source 112 of the first vertical structure 110. The unoxidized portion 704 may have a thickness gradient from top to bottom. For example, the unoxidized portion 704 is thicker in the bottom and thinner in the top.

Figure 8:
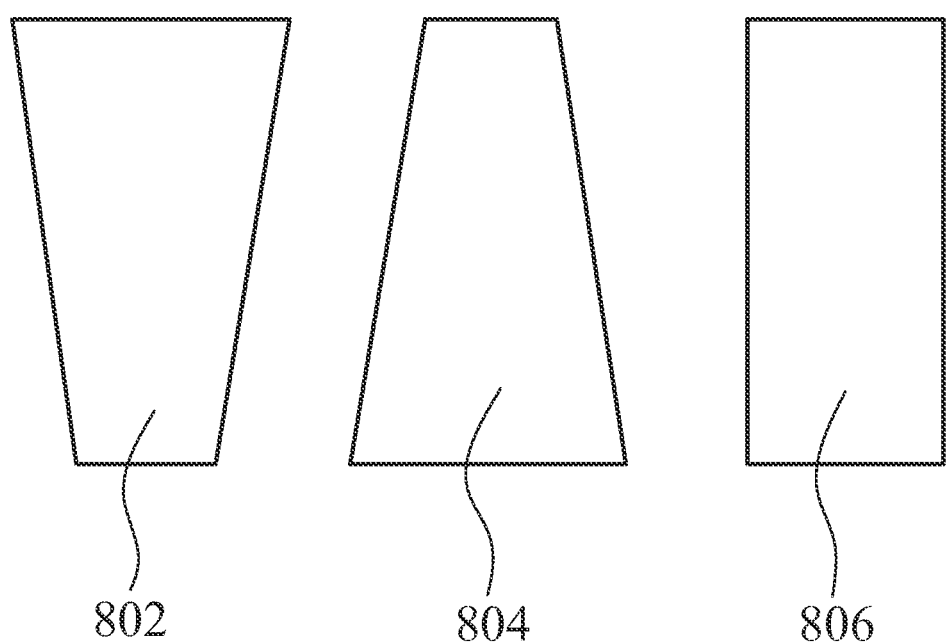
FIG. 8 is a sectional view illustrating the shape of the vertical structure in accordance with some embodiments.

FIG. 8 is a sectional view illustrating the shape of the vertical structure in accordance with some embodiments. As shown in FIG. 8, initially the vertical structures 110, 120 in FIG. 1 having a source, a channel and a drain may be in a shape selecting from an inverse-trapezoid 802, a trapezoid 804, and a rectangle 806. In FIG. 7, compared to FIG. 1, the shape of the vertical structures 110, 120 may be the same or change by adjusting parameters (such as doping angles) of the cluster oxygen doping treatment.

Figure 9:
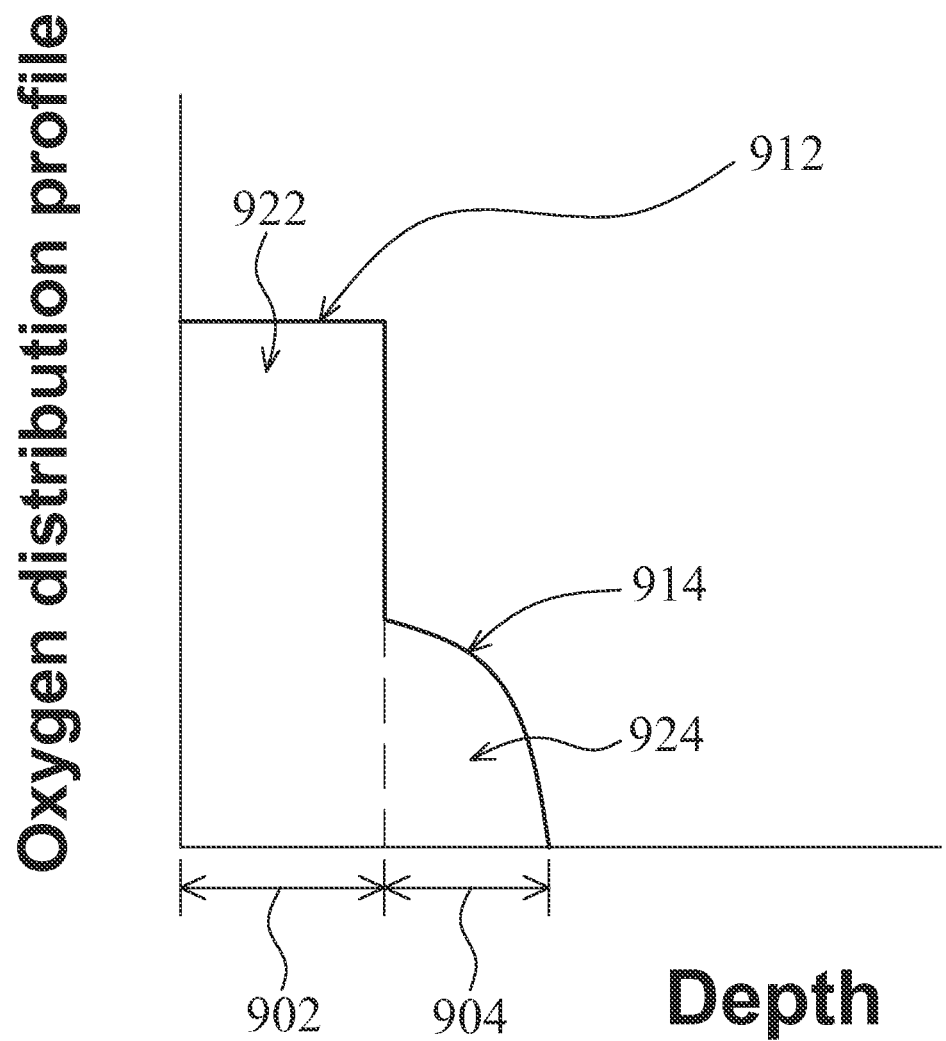
FIG. 9 is a plot illustrating oxygen distribution profile with regard to depth of the bottom isolation layer in accordance with some embodiments.

FIG. 9 is a plot illustrating an oxygen distribution profile with regard to depth of the bottom isolation layer in accordance with some embodiments. As shown in FIG. 9, oxygen concentration of the bottom isolation layer 502 in FIG. 7 has a box-like region 922 with a tailing region 924. The box-like region 922 has a first depth 902 of about 1 nm to about 10 nm. The oxygen concentration 912 in the box-like region 922 is about $10^{20}/cm^3$ to about $5*10^{22}/cm^3$. The tailing region 924 has a second depth 904 of about 1 nm to about 10 nm, and the second oxygen concentration 914 in the tailing region 924 is about $10^{19}/cm^3$ to about $10^{20}/cm^3$.

Figure 10:
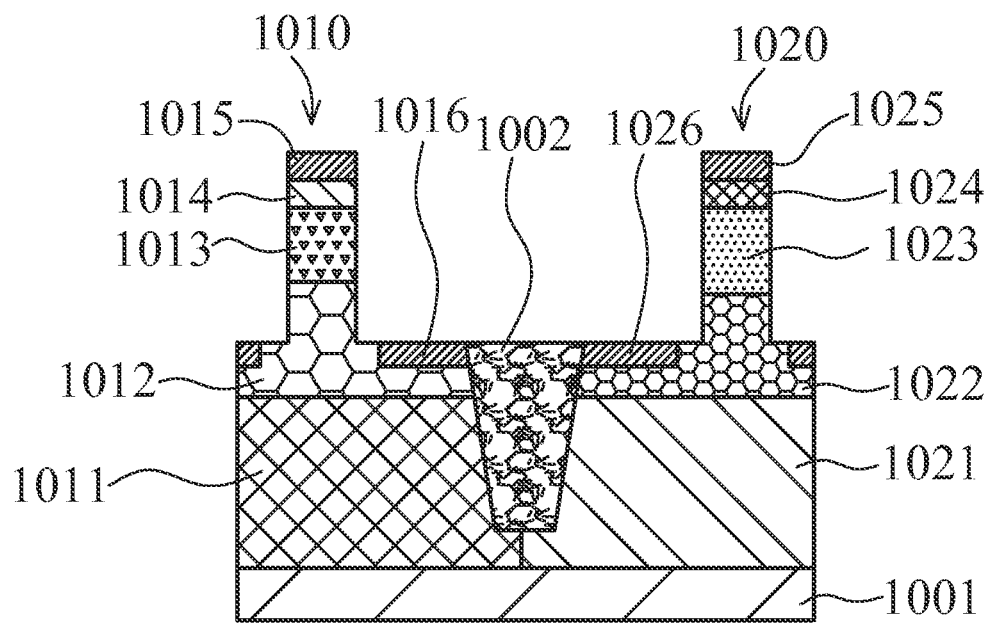
FIG. 10 is a sectional view illustrating an exemplary semiconductor device in accordance with some embodiments.

FIG. 10 is a sectional view illustrating an exemplary semiconductor device 1000 in accordance with some embodiments. As shown in FIG. 10, a semiconductor device 1000 is provided. In the semiconductor device 1000, a first vertical structure 1010 and a second vertical structure 1020 are provided over a substrate 1001. The first vertical structure 1010 and the second vertical structure 1020 may be vertical-gate-all-around devices electrically isolated by a shallow trench isolation 1002. The first vertical structure 1010 may be a PMOS, and may include an n-well 1011, a first source 1012, a first channel 1013 and a first drain 1014. The second vertical structure 1020 may be a NMOS, and may include a p-well 1021, a second source 1022, a second channel 1023 and a second drain 1024. Salicides 1015, 1016, 1025, 1026 are used to reduce contact resistance.

The first source 1012 may be disposed over the n-well 1011. The first channel 1013 may be disposed over the first source 1012. The first drain 1014 may be disposed over the first channel 1013. The second source 1022 may be disposed over the p-well 1021. The second channel 1023 may be disposed over the second source 1022. The second drain 1024 may be disposed over the second channel 1023. The following procedures may be performed on the first vertical structure 1010 and the second vertical structure 1020, so will only be discussed below with respect to the first vertical structure 110.

Figure 11:
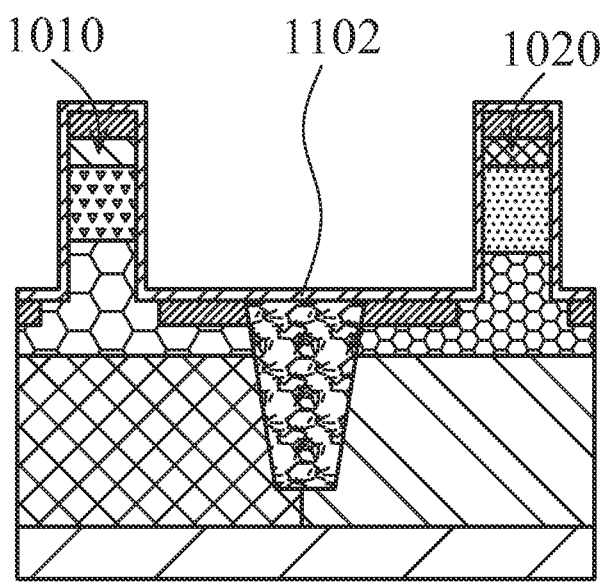
FIG. 11 is a sectional view illustrating the exemplary semiconductor device in accordance with some embodiments.

FIG. 11 is a sectional view illustrating the exemplary semiconductor device in accordance with some embodiments. As shown in FIG. 11, an etch stop layer 1102 is formed over the first vertical structure 1010 and the second vertical structure 1020. The etch stop layer 1102 may be formed of SiN. The etch stop layer 1102 may have a thickness of, for example, about 10 nanometers.

Figure 12:
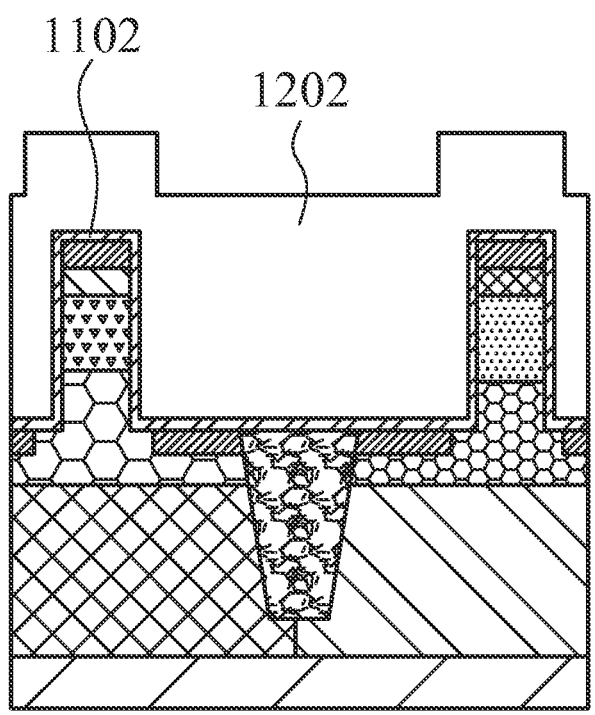
FIG. 12 is a sectional view illustrating the exemplary semiconductor device in accordance with some embodiments.

FIG. 12 is a sectional view illustrating the exemplary semiconductor device in accordance with some embodiments. As shown in FIG. 12, a first oxide layer 1202 is formed over the etch stop layer 1102 by using a flowable chemical vapor deposition (F-CVD) process or a high-density plasma chemical vapor deposition (HDP-CVD) process.

Figure 13:
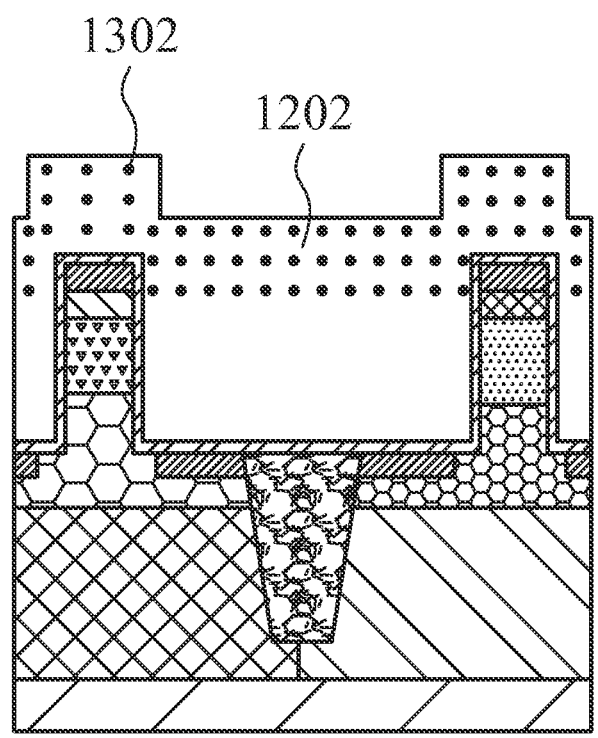
FIG. 13 is a sectional view illustrating the exemplary semiconductor device in accordance with some embodiments.

FIG. 13 is a sectional view illustrating the exemplary semiconductor device in accordance with some embodiments. As shown in FIG. 13, by using an oxygen plasma treatment to dope oxygen 1302, a portion of the first oxide layer 1202 is oxidized. A furnace annealing process may not be necessary and replaced by a rapid thermal annealing process. The rapid thermal annealing may be set as follows: a temperature of about 300° C. to about 1000° C. and a duration of about 0.01 second to about 10 seconds.

In the embodiment, the oxygen plasma treatment parameters are set as follows: a power of about 1 KW to about 100 KW, an oxygen flow of about 10 SCCM to about 1000 SCCM and a pressure of about 0.5 Torr to about 1000 Torr.

Figure 14:
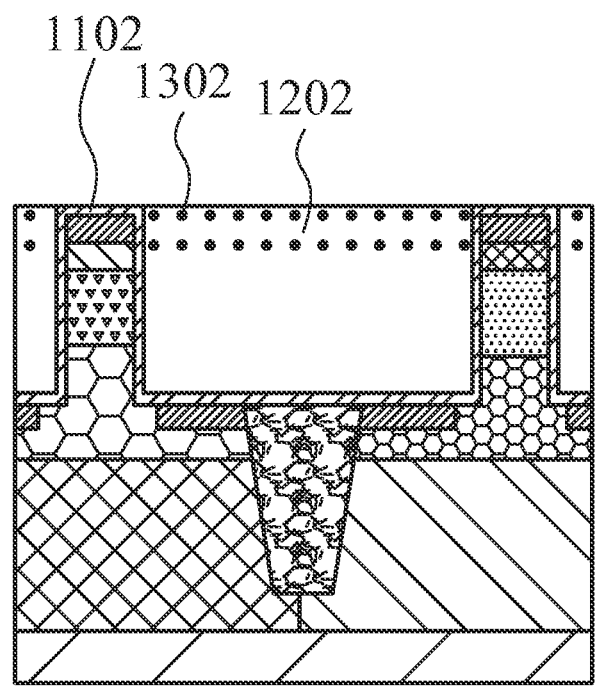
FIG. 14 is a sectional view illustrating the exemplary semiconductor device in accordance with some embodiments.

FIG. 14 is a sectional view illustrating the exemplary semiconductor device in accordance with some embodiments. As shown in FIG. 14, a chemical mechanical polishing process is performed on the first oxide layer 1202 with oxygen doping, stopping at the etch stop layer 1102. The oxygen 1302 may harden the first oxide layer 1202 formed of, for example, the flowable CVD to reduce the over-polishing of the first oxide layer 1202 and to improve the polishing selectivity between the first oxide layer 1202 and the etch stop layer 1102. The processes to be performed on the semiconductor device 1000 in FIG. 14 are shown in FIGS. 5-7 and are not repeated herein.

Figure 15:
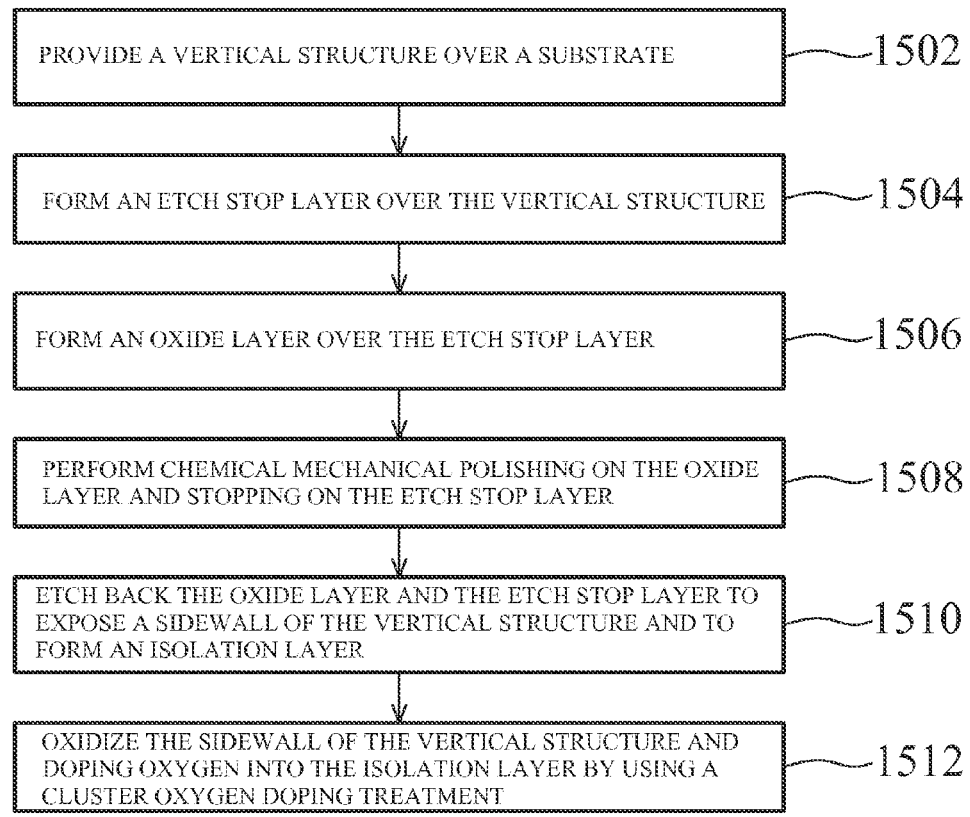
FIG. 15 is a flow chart for forming a semiconductor device in accordance with some embodiments.

FIG. 15 is a flow chart for forming a semiconductor device in accordance with some embodiments. As shown in FIG. 15, a method 1500 is provided. The method 3600 includes the following operations: providing a vertical structure over a substrate (1502); forming an etch stop layer over the vertical structure (1504); forming an oxide layer over the etch stop layer (1506); performing chemical mechanical polishing on the oxide layer and stopping on the etch stop layer (1508); etching back the oxide layer and the etch stop layer to expose a sidewall of the vertical structure and to form an isolation layer (1510); oxidizing the sidewall of the vertical structure and doping oxygen into the isolation layer by using a cluster oxygen doping treatment (1512).

In the embodiment, the operation 1510 may further comprise: etching back the oxide layer and the etch stop layer to expose a portion of the etch stop layer adjacent to the sidewall of the vertical structure. The method 1500 may further comprise: oxidizing the portion of the etch stop layer adjacent to the sidewall of the vertical structure to make a thickness gradient from top to bottom. The operation of oxidizing the portion of the etch stop layer adjacent to the sidewall of the vertical structure by using the cluster oxygen doping treatment may further include oxidizing the portion of the etch stop layer adjacent to the sidewall of the vertical structure without oxidizing a portion of the etch stop layer below the isolation layer.

In the embodiment, the operation 1512 may further comprise: using the cluster oxygen doping treatment with a cluster number of about 10 to about 10000, a cluster size about 1 nm to about 1000 nm, a cluster oxygen energy of about 3 KV to about 100 KV and a cluster oxygen dose of about $10^{11}/cm^3$ to about $10^{16}/cm^3$. The method 1500 may further include removing the oxidized sidewall of the vertical structure to trim a critical dimension of the vertical structure. The operation 1512 may further comprise: providing the vertical structure in a shape selecting from trapezoid, inverse-trapezoid and rectangle. The method 1500 may further include changing the shape of the vertical structure.

In the embodiment, the operation 1502 may further comprise: providing the vertical structure selected from the group consisting of silicon semiconductors or iii-v semiconductors. The operation 1506 may further include forming the oxide layer by using a flowable CVD process. The operation 1506 may further include forming the oxide layer by using a high-density plasma CVD process.

Figure 16:
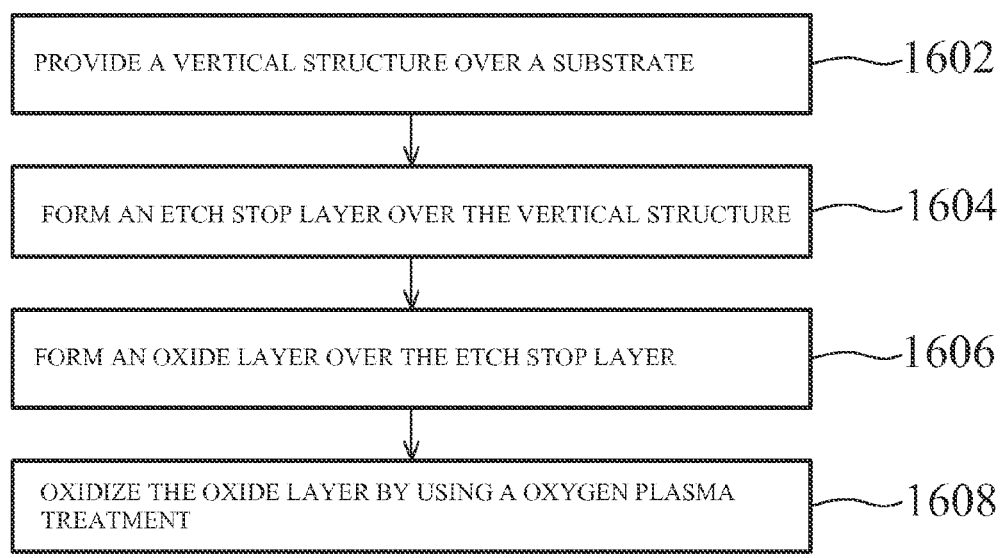
FIG. 16 is a flow chart for forming a semiconductor device in accordance with some embodiments.

FIG. 16 is a flow chart for forming a semiconductor device in accordance with some embodiments. As shown in FIG. 16, a method 1600 is provided. The method 1600 includes the following operations: providing a vertical structure over a substrate (1602); forming an etch stop layer over the vertical structure (1604); forming an oxide layer over the etch stop layer (1606); oxidizing the oxide layer by using a oxygen plasma treatment (1608).

The operation 1608 may further include oxidizing the oxide layer without furnace annealing. The operation 1608 may further include using the oxygen plasma treatment with a power of about 1 KW to about 100 KW, an oxygen flow of about 10 SCCM to about 1000 SCCM and a pressure of about 0.5 Torr to about 1000 Torr. The method 1600 may further include performing a rapid thermal annealing with a temperature of about 300° C. to about 1000° C. and a duration of about 0.01 second to about 10 seconds.

The disclosure describes a method for forming a vertical transistor (including a nanowire) which may utilize cluster oxygen doping treatment to trim the critical dimension and to use oxygen plasma doping treatment only or combined with cluster oxygen doping treatment to reduce thermal annealing temperature of the CVD and to improve the properties of the isolation layer.

According to an exemplary embodiment, a method of forming a semiconductor device is provided. The method includes: providing a vertical structure over a substrate; forming an etch stop layer over the vertical structure; forming an oxide layer over the etch stop layer; performing chemical mechanical polishing on the oxide layer and stopping on the etch stop layer; etching back the oxide layer and the etch stop layer to expose a sidewall of the vertical structure and to form an isolation layer; oxidizing the sidewall of the vertical structure and doping oxygen into the isolation layer by using a cluster oxygen doping treatment.

According to an exemplary embodiment, a method of forming a semiconductor device is provided. The method includes: providing a vertical structure over a substrate; forming an etch stop layer over the vertical structure; forming an oxide layer over the etch stop layer; and oxidizing the oxide layer by using a oxygen plasma treatment.

According to an exemplary embodiment, a vertical structure is provided. The vertical structure includes: a source; a channel over the source; a drain over the channel; and an oxide layer contacting the source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    providing a vertical structure over a substrate;
    forming an etch stop layer over the vertical structure;
    forming an oxide layer over the etch stop layer; and
    oxidizing the oxide layer by using an oxygen plasma treatment.

2. The method of claim 1, wherein oxidizing the oxide layer by using the oxygen plasma treatment further comprises oxidizing the oxide layer without furnace annealing.

3. The method of claim 1, wherein oxidizing the oxide layer by using the oxygen plasma treatment further comprises using the oxygen plasma treatment with a power of about 1 KW to about 100 KW, an oxygen flow of about 10 SCCM to about 1000 SCCM and a pressure of about 0.5 Torr to about 1000 Torr.

4. The method of claim 1, further comprising performing a rapid thermal annealing with a temperature of about 300° C. to about 1000° C. and a duration of about 0.01 second to about 10 seconds.

5. The method of claim 1, wherein forming the oxide layer over the etch stop layer further comprises forming the oxide layer by using flowable chemical vapor deposition.

6. The method of claim 1, wherein forming the oxide layer over the etch stop layer further comprises forming the oxide layer by using high-density plasma chemical vapor deposition.

7. The method of claim 1, further comprising performing chemical mechanical polishing on the oxide layer and stopping on the etch stop layer.

8. A method of forming a semiconductor device, comprising:
    providing a vertical structure over a substrate;
    forming a nitride layer over the vertical structure;
    forming an oxide layer over the nitride layer; and
    oxidizing the oxide layer by using an oxygen plasma treatment and without furnace annealing.

9. The method of claim 8, wherein oxidizing the oxide layer by using the oxygen plasma treatment further comprises using the oxygen plasma treatment with a power of about 1 KW to about 100 KW, an oxygen flow of about 10 SCCM to about 1000 SCCM and a pressure of about 0.5 Torr to about 1000 Torr.

10. The method of claim 8, further comprising performing a rapid thermal annealing with a temperature of about 300° C. to about 1000° C. and a duration of about 0.01 second to about 10 seconds.

11. The method of claim 8, wherein forming the oxide layer over the nitride layer further comprises forming the oxide layer by using flowable chemical vapor deposition.

12. The method of claim 8, wherein forming the oxide layer over the nitride layer further comprises forming the oxide layer by using high-density plasma chemical vapor deposition.

13. The method of claim 8, further comprising performing chemical mechanical polishing on the oxide layer and stopping on the nitride layer.

14. A method comprising:
    providing a semiconductor device including
        a substrate, and
        a vertical structure over the substrate and including a source and a drain that are one above the other and a channel that is between the source and the drain;
    forming an etch stop layer over the substrate and the vertical structure;
    forming an oxide layer over the etch stop layer;
    oxidizing the oxide layer; and
    performing on the oxide layer a chemical mechanical polishing (CMP) process that stops at the etch stop layer.

15. The method of claim 14, wherein oxidizing the oxide layer is prior to performing the CMP process.

16. The method of claim 14, wherein oxidizing the oxide layer includes doping the oxide layer with oxygen using an oxygen plasma treatment.

17. The method of claim 14, wherein forming the etch stop layer includes forming the etch stop layer such that the etch stop layer has a substantially uniform thickness.

18. The method of claim 14, wherein forming the oxide layer includes forming the oxide layer using a flowable chemical vapor deposition.

19. The method of claim 14, wherein forming the oxide layer includes forming the oxide layer using a high-density plasma chemical vapor deposition.

20. The method of claim 14, further comprising performing a rapid thermal annealing on the oxide layer.

* * * * *